United States Patent
Schmalbuch et al.

(10) Patent No.: US 9,967,967 B2
(45) Date of Patent: May 8, 2018

(54) PANE HAVING AN ELECTRICAL CONNECTION ELEMENT

(71) Applicant: SAINT-GOBAIN GLASS FRANCE, Courbevoie (FR)

(72) Inventors: Klaus Schmalbuch, Aachen (DE); Bernhard Reul, Herzogenrath (DE); Mitja Rateiczak, Wuerselen (DE); Lothar Lesmeister, Landgraaf (NL)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 19 days.

(21) Appl. No.: 14/424,936

(22) PCT Filed: Jul. 10, 2013

(86) PCT No.: PCT/EP2013/064576
§ 371 (c)(1),
(2) Date: Feb. 27, 2015

(87) PCT Pub. No.: WO2014/040774
PCT Pub. Date: Mar. 20, 2014

(65) Prior Publication Data
US 2015/0264800 A1    Sep. 17, 2015

(30) Foreign Application Priority Data
Sep. 14, 2012 (EP) .................................... 12184407

(51) Int. Cl.
*H05B 3/08* (2006.01)
*H05K 1/02* (2006.01)
(Continued)

(52) U.S. Cl.
CPC ......... *H05K 1/0212* (2013.01); *B23K 1/0016* (2013.01); *B23K 31/02* (2013.01);
(Continued)

(58) Field of Classification Search
CPC ...... H05K 1/0212; H05K 1/0303; H05K 1/09; H05K 1/11; H05K 1/0306;
(Continued)

(56) References Cited

U.S. PATENT DOCUMENTS 2,481,385 A    9/1949  Bloom
2,644,066 A    6/1953  Glynn
(Continued)

FOREIGN PATENT DOCUMENTS

CN    200944682 Y    9/2007
DE    10046489       12/2001
(Continued)

OTHER PUBLICATIONS

Written Opinion, mailed on Oct. 22, 2013 for PCT/EP2013/064576 filed on Jul. 10, 2013 in the name of Saint-Gobain Glass France (English + German).
(Continued)

*Primary Examiner* — Shawntina Fuqua
(74) *Attorney, Agent, or Firm* — Steinfl + Bruno LLP

(57) ABSTRACT

A pane having an electrical connection element, the pane having: a substrate; an electrically conductive structure in a region of the substrate; and a connection element in a region of the electrically conductive structure, the connection element containing at least a chromium-containing steel. The connection element has a region which is crimped about a connecting cable and a soldering region connected to the electrically conductive structure by means of a lead-free solder.

23 Claims, 5 Drawing Sheets

Figure 1:
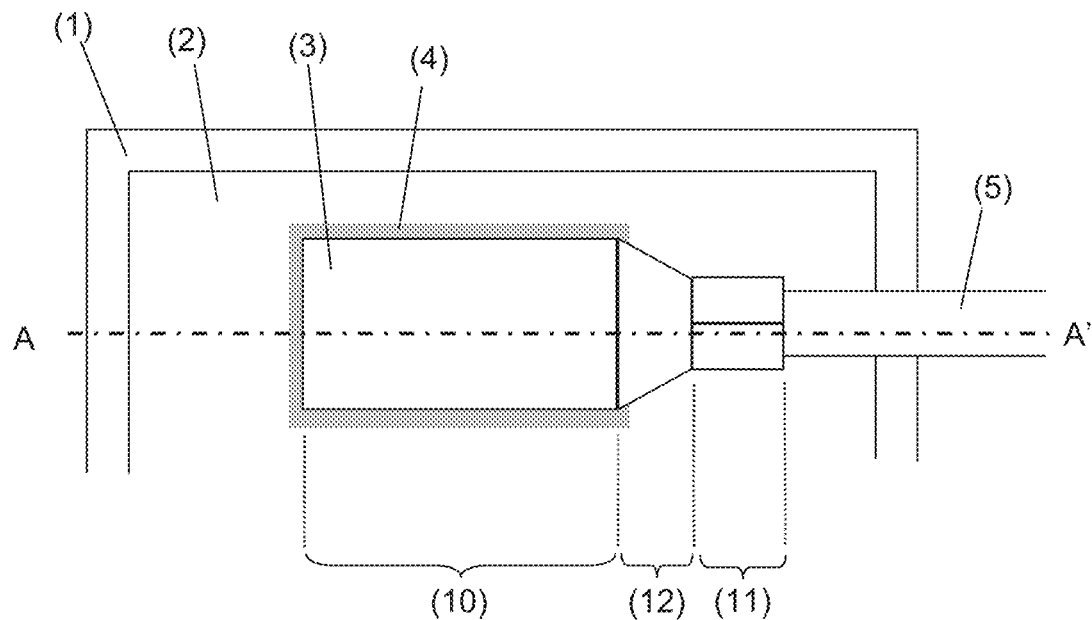

(51) Int. Cl.
*H01R 12/53* (2011.01)
*H01R 12/57* (2011.01)
*B23K 1/00* (2006.01)
*B23K 31/02* (2006.01)
*H01Q 1/12* (2006.01)
*H01R 43/02* (2006.01)
*H01R 43/048* (2006.01)
*H05B 3/84* (2006.01)
*H05K 1/03* (2006.01)
*H05K 1/09* (2006.01)
*H05K 1/11* (2006.01)
*H01R 4/02* (2006.01)
*H01R 4/18* (2006.01)

(52) U.S. Cl.
CPC .......... *H01Q 1/1271* (2013.01); *H01R 12/53* (2013.01); *H01R 12/57* (2013.01); *H01R 43/0235* (2013.01); *H01R 43/048* (2013.01); *H05B 3/84* (2013.01); *H05K 1/0306* (2013.01); *H05K 1/09* (2013.01); *H05K 1/11* (2013.01); *H01R 4/02* (2013.01); *H01R 4/184* (2013.01); *H01R 2201/02* (2013.01); *H01R 2201/26* (2013.01); *H05B 2203/016* (2013.01); *H05K 2201/068* (2013.01)

(58) Field of Classification Search
CPC .............. H05K 2201/068; B23K 31/02; B23K 1/0016; H01Q 1/1271; H01R 12/53; H01R 12/57; H01R 43/048; H01R 43/0235; H01R 4/184; H01R 4/02; H01R 2201/02; H01R 2201/26; H05B 3/84; H05B 2203/016
See application file for complete search history.

(56) References Cited

U.S. PATENT DOCUMENTS

| | | | |
|---|---|---|---|
| 2,709,211 A | 5/1955 | Glynn | |
| 3,880,369 A | 4/1975 | Kunstovney et al. | |
| 4,403,307 A | 9/1983 | Maeda | |
| 5,596,335 A | 1/1997 | Dishart et al. | |
| 5,738,554 A | 4/1998 | Borger et al. | |
| 6,638,120 B2 | 10/2003 | Costa | |
| 6,790,104 B2 | 9/2004 | Antaya et al. | |
| 7,134,201 B2 | 11/2006 | Ackerman et al. | |
| 7,514,654 B2 | 4/2009 | Okajima et al. | |
| 7,909,665 B2 | 3/2011 | Lyon | |
| 9,837,727 B2 | 12/2017 | Schmalbuch et al. | |
| 2002/0001997 A1 | 1/2002 | Reul | |
| 2002/0111081 A1 | 8/2002 | Machado | |
| 2003/0030064 A1 | 2/2003 | Takano et al. | |
| 2006/0240265 A1 | 10/2006 | Cook et al. | |
| 2007/0105412 A1 | 5/2007 | Hoepfner et al. | |
| 2007/0224842 A1* | 9/2007 | Hoepfner | H01R 4/02 439/34 |
| 2008/0164248 A1 | 7/2008 | Reul | |
| 2008/0230269 A1 | 9/2008 | Susai et al. | |
| 2009/0044464 A1 | 2/2009 | Schmidt et al. | |
| 2009/0277671 A1 | 11/2009 | Hahn | |
| 2010/0321798 A1 | 12/2010 | Chen et al. | |
| 2011/0056589 A1 | 3/2011 | De Boer et al. | |
| 2011/0056747 A1 | 3/2011 | Matsushita et al. | |
| 2012/0305311 A1 | 12/2012 | Jenrich | |
| 2012/0318566 A1 | 12/2012 | Reul et al. | |
| 2013/0043066 A1 | 2/2013 | Cholewa et al. | |
| 2014/0158424 A1 | 6/2014 | Schlarb et al. | |
| 2014/0170913 A1* | 6/2014 | Degen | H05B 3/84 439/887 |
| 2014/0301892 A1 | 10/2014 | Maekawa et al. | |
| 2015/0236431 A1 | 8/2015 | Schmalbuch et al. | |

FOREIGN PATENT DOCUMENTS

| | | |
|---|---|---|
| DE | 20203202 | 6/2006 |
| DE | 102006017675 A1 | 10/2007 |
| DE | 202008015441 U1 | 4/2010 |
| DE | 102009016353 A1 | 10/2010 |
| DE | 102010018860 | 11/2011 |
| EP | 23121 A1 | 1/1981 |
| EP | 488878 A1 | 6/1992 |
| EP | 720253 A2 | 7/1996 |
| EP | 1488972 | 12/2004 |
| EP | 1942703 | 7/2008 |
| EP | 2299544 | 3/2011 |
| EP | 2365730 | 9/2011 |
| EP | 2408260 | 1/2012 |
| GB | 1163224 A | 9/1969 |
| JP | S5678170 A | 6/1981 |
| JP | H0696847 A | 4/1994 |
| JP | H08246105 A | 9/1996 |
| JP | 2007335260 A | 12/2007 |
| JP | 2008218399 A | 9/2008 |
| MX | 2013015237 A | 2/2014 |
| WO | 2004012302 A1 | 2/2004 |
| WO | 2004/068643 A1 | 8/2004 |
| WO | 2006098160 A1 | 9/2006 |
| WO | 2006132319 A1 | 12/2006 |
| WO | 2007110610 | 10/2007 |
| WO | 2009135469 A1 | 11/2009 |
| WO | 2012152543 | 11/2012 |

OTHER PUBLICATIONS

Written Opinion, mailed on Oct. 17, 2013 for PCT/EP2013/064575 filed on Jul. 10, 2013 in the name of Saint-Gobain Glass France(English + German).
PCT International Search Report mailed on Oct. 17, 2013 for PCT/EP2013/064575 filed on Jul. 10, 2013 in the name of Saint-Gobain Glass France.
PCT International Search Report mailed on Oct. 22, 2013 for PCT/EP2013/064576 filed on Jul. 10, 2013 in the name of Saint-Gobain Glass France.
Non-Final Office Action for U.S. Appl. No. 14/424,936, filed Feb. 27, 2015 in the name of Klaus Schmalbuch et al. Mail Date: Sep. 8, 2016. 7 pages.
PCT Written Opinion for PCT/EP2012/056963 filed Apr. 17, 2012 on behalf of Saint-Gobain Glass France. Mail Date: Jun. 1, 2012. 12 pages. German original + English translation.
PCT Written Opinion for PCT/EP2012/056964 filed Apr. 17, 2012 on behalf of Saint-Gobain Glass France. Mail Date: Jun. 14, 2012. 16 pages. German original + English translation.
PCT International Preliminary Report on Patentability for PCT/EP2012/056963 filed Apr. 17, 2012 on behalf of Saint-Gobain Glass France. Mail Date: Nov. 12, 2013. 14 pages German original + English translation.
PCT International Preliminary Report on Patentability for PCT/EP2012/056964 filed Apr. 17, 2012 on behalf of Saint-Gobain Glass France. Mail Date: Nov. 12, 2013. 18 pages German original + English translation.
PCT International Preliminary Report on Patentability for PCT/EP2012/056965 filed Apr. 17, 2012 on behalf of Saint-Gobain Glass France. Mail Date: Nov. 12, 2013. 13 pages German original + English translation.
PCT International Search Report for PCT/EP2012/056964 filed Apr. 17, 2012 on behalf of Saint-Gobain Glass France. Mail Date: Jun. 14, 2012. 5 pages. German original + English translation.
PCT International Search Report for PCT/EP2012/056965 filed Apr. 17, 2012 on behalf of Saint-Gobain Glass France. Mail Date: Jun. 8, 2012. 7 pages. German original + English translation.
PCT International Search Report for PCT/EP2012/056963 filed Apr. 17, 2012 on behalf of Saint-Gobain Glass France. Mail Date: Jun. 1, 2012. 7 pages. German original + English translation.
Restriction Requirement for U.S. Appl. No. 14/115,091, filed Feb. 10, 2014 on behalf of Harald Cholewa. Mail Date: Sep. 9, 2015. 10 pages.

(56) References Cited

OTHER PUBLICATIONS

Non-Final Office Action for U.S. Appl. No. 14/115,091, filed Feb. 10, 2014 on behalf of Harald Cholewa. Mail Date: Jan. 20, 2015. 22 pages.
Final Office Action for U.S. Appl. No. 14/115,091, filed Feb. 10, 2014 on behalf of Harald Cholewa. Mail Date: Jun. 14, 2016. 15 pages.
Restriction Requirement for U.S. Appl. No. 14/115,839, filed Feb. 21, 2014 on behalf of Christoph Degen. Mail Date: Jan. 11, 2016. 9 pages.
Non-Final Office Action for U.S. Appl. No. 14/115,839, filed Feb. 21, 2014 on behalf of Christoph Degen. Mail Date: May 4, 2016. 17 pages.
Final Office Action for U.S. Appl. No. 14/115,839, filed Feb. 21, 2014 on behalf of Christoph Degen. Mail Date: Oct. 19, 2016. 15 pages.
Non-Final Office Action for U.S. Appl. No. 14/424,939, filed Feb. 27, 2015 on behalf of Klaus Schmalbuch. Mail Date: Feb. 4, 2016. 17 pages.
Non-Final Office Action for U.S. Appl. No. 14/424,939, filed Feb. 27, 2015 on behalf of Klaus Schmalbuch. Mail Date: Jul. 6, 2016. 16 pages.
Non-Final Office Action for U.S. Appl. No. 14/424,939, filed Feb. 27, 2015 on behalf of Klaus Schmalbuch. Mail Date: Dec. 12, 2016. 30 pages.
Advisory Action for U.S. Appl. No. 14/424,939, filed Feb. 27, 2015 on behalf of Klaus Schmalbuch. dated Mar. 6, 2017. 2 pages.
Notice of Allowance for U.S. Appl. No. 14/424,939, filed Feb. 27, 2015 on behalf of Klaus Schmalbuch. dated Jun. 5, 2017. 10 pages.
Notice of Allowance for U.S. Appl. No. 14/424,939, filed Feb. 27, 2015 on behalf of Klaus Schmalbuch. dated Sep. 26, 2017. 9 pages.

\* cited by examiner

PANE HAVING AN ELECTRICAL CONNECTION ELEMENT

CROSS REFERENCE TO RELATED APPLICATIONS

The present application is the US national stage of International Patent Application PCT/EP2013/064576 filed internationally on Jul. 10, 2013 which, in turn, claims priority to European Patent Application No. 12184407.0 filed on Sep. 14, 2012.

The invention relates to a pane with an electrical connection element, an economical and environmentally friendly method for its production, and its use.

The invention relates in particular to a pane with an electrical connection element for motor vehicles with electrically conductive structures such as, for instance, heating conductors or antenna conductors. The electrically conductive structures are customarily connected to the onboard electrical system via soldered-on electrical connection elements. Due to different coefficients of thermal expansion of the materials used, mechanical stresses occur during production and operation that strain the panes and can cause breakage of the pane.

Lead-containing solders have high ductility that can compensate the mechanical stresses occurring between an electrical connection element and the pane by plastic deformation. However, because of the End of Life Vehicles Directive 2000/53/EC, lead-containing solders have to be replaced by lead-free solders within the EC. The directive is referred to, in summary, by the acronym ELV (End of Life Vehicles). Its objective is to ban extremely problematic components from products resulting from the massive increase in disposable electronics. The substances affected are lead, mercury, and cadmium. This relates, among other things, to the implementation of lead-free soldering materials in electrical applications on glass and the introduction of corresponding replacement products.

A number of electrical connection elements for leadfree soldering to electrically conductive structures have been proposed. Reference is made, by way of example, to the documents US 20070224842 A1, EP 1942703 A2, WO 2007110610 A1, EP 1488972 A1, and EP 2365730 A1. The shape of the connection element, on the one hand, and the material of the connection element, on the other, assume critical significance with regard to the avoidance of thermal stresses.

The object of the present invention is to provide a pane with an electrical connection element that is particularly suited for soldering using leadfree solder materials, wherein critical mechanical stresses in the pane are avoided. Moreover, an economical and environmentally friendly method for their production is to be provided.

The object of the present invention is accomplished according to the invention by a pane with at least one electrical connection element according to the independent claim 1. Preferred embodiments emerge from the subclaims.

The pane according to the invention with at least one electrical connection element comprises at least the following characteristics:
a substrate,
on a region of the substrate, an electrically conductive structure,
on a region of the electrically conductive structure, a connection element that includes at least a chromium-containing steel,
wherein the connection element has a region crimped around a connection cable and a solder region and wherein the solder region is connected to the electrically conductive structure via a leadfree solder material.

According to the invention, the electrical connection element is connected to the connection cable by crimping. The crimp connection is simple, economical, and quick to produce and can be readily automated. Costly additional process steps, for example, soldering or welding the connection element to the connection cable can be avoided. At the same time, a very stable connection between the connection element and the connection cable is provided. The connection element according to the invention with the crimped region (the so-called crimp, i.e., the region deformed by the crimping procedure) can be produced simply and economically and enables space-saving, flexibly usable, and durably stable electrical contacting of the electrically conductive structure.

Chromium-containing, in particular so-called "stainless steel" or "corrosion resistant steel" steel is available economically. Connection elements made of chromium-containing steel also have high rigidity in comparison to many conventional connection elements, made, for example, of copper, which results in an advantageous stability of the crimped connection. Chromium-containing steel has good cold formability, because of which it is particularly suited for production of crimp connections. In addition, compared to many conventional connection elements, for example, those made of titanium, chromium-containing steel has improved solderability, due to higher thermal conductivity.

The connection cable is provided to electrically connect the electrically conductive structure to an external functional element, for example, a power supply or a receiver. For this, the connection cable is guided away from the pane starting from the connection element preferably beyond the side edges of the pane. The connection cable can, in principle, be any connection cable that is known to the person skilled in the art for the electrical contacting of an electrically conductive structure and is suitable for being connected by crimping to the connection element (also called "crimp contact"). The connection cable can include, in addition to an electrically conductive core (inner conductor), an insulating, preferably polymer sheathing, with the insulating sheathing preferably removed in the end region of the connection cable to enable an electrically conductive connection between the connection element and the inner conductor.

The electrically conductive core of the connection cable can, for example, include copper, aluminum, and/or silver or alloys or mixtures thereof. The electrically conductive core can, for example, be implemented as a stranded wire conductor or as a solid wire conductor. The cross-section of the electrically conductive core of the connection cable depends on the current-carrying capacity required for the application of the pane according to the invention and can be selected appropriately by the person skilled in the art. The cross-section is, for example, from 0.3 mm² to 6 mm².

The connection element, which includes, according to the invention, at least a chromium-containing steel and is preferably made from the chromium-containing steel, is preferably crimped in the end region of the connection cable around the electrically conductiven core of the connection cable such that a durably stable electrically conductive connection is developed between the connection element and the connection cable. The crimping is done with a suitable crimping tool, known per se to the person skilled in the art, for example, crimping pliers or a crimping press.

Customarily, the crimping tool comprises two active points, for example, the jaws of crimping pliers, which are guided against each other, by which means mechanical pressure is exerted on the connection element. The connection element is thus plastically deformed and squeezed around the connection element.

In a preferred embodiment of the electrical connection element according to the invention, the solder region is disposed on the side of the crimped region which faces the extension direction of the connection cable to the external function element. The angle between the solder region and the crimped region is preferably from 120° to 180°, particularly preferably from 150° to 170°. By this means, a particularly space-saving and stable electrical contacting of the electrically conductive structure can be obtained.

The surface of the solder region facing the substrate forms the contact surface between the connection element and the electrically conductive structure and is connected to the electrically conductive structure via the solder material. Here, this means a direct, mechanical connection between the solder region and the electrically conductive structure via the solder material. This means that the solder material is disposed between the solder region and the electrically conductive structure and thus fixes the solder region durably stably on the electrically conductive structure.

In the solder region and in the crimped region, the connection element preferably has the same material thickness. This is particularly advantageous with regard to simple production of the connection element, since the connection element can be punched from a single sheet of metal. The material thickness of the connection element is preferably from 0.1 mm to 2 mm, particularly preferably from 0.2 mm to 1 mm, very particularly preferably from 0.3 mm to 0.5 mm. In this range for the material thickness, the connection element has, on the one hand, the cold formability necessary for the crimping. On the other hand, in this range for the material thickness, an advantageous stability of the crimped connection and an advantageous electrical connection between the electrically conductive structure and the connection cable are obtained.

The length and the width of the solder region are preferably from 1 mm to 10 mm, particularly preferably from 2 mm to 8 mm, and very particularly preferably from 2.5 mm to 5 mm. This is particularly advantageous in view of a small space requirement of the connection element and effective electrical contacting of the electrically conductive structure.

In a preferred embodiment, the solder region is implemented flat, which yields a flat contact surface. However, the solder region can also have regions introduced by reshaping, such as stamping or deep drawing, for example, solder depots, spacers, or contact bumps. Apart from the reshaped regions, the contact surface is preferably flat.

The shape of the solder region and of the contact surface can be selected according to the requirements in the individual case and can, for example, be polygonal, rectangular, rectangular with rounded corners, oval, elliptical, or circular.

The length of the crimped region can be appropriately selected by the person skilled in the art taking into account the diameter of the connection cable as well as applicable standards and is, for example, from 2 mm to 8 mm or from 4 mm to 5 mm, in particular 4.5 mm. This is particularly advantageous in view of a small space requirement of the connection element and a stable connection between the connection element and the connection cable. Preferably, the crimp is implemented as an open crimp. Since, in this case, the connection cable does not have to be inserted into an all-around closed wire-end ferrule (closed crimp), such a crimp connection is easier to produce and can be readily automated and is, consequently, particularly suited for mass production. The shape of the crimp can be freely selected, for example, as a B-crimp or an O-crimp.

The solder region can be connected directly to the crimped region of the connection element. However, a transition region, for example, with a length of 1 mm to 5 mm can be disposed between the solder region and the crimped region. By means of a transition region, the flexibility in the design of the connection element is increased.

In addition to the crimped region, one or a plurality of other regions can be connected to the solder region. For example, another region can be disposed on the side edge of the solder region opposite the crimped region. Such another region can, for example, be provided to connect the connection element to a mounting bracket. For example, by means of a shared mounting bracket, a plurality of connection elements according to the invention can be soldered to the electrically conductive structure in a defined relative arrangement.

In an advantageous embodiment, the pane has from two to six electrical connection elements according to the invention. By means of multiple connection elements, an electrically conductive structure implemented as a heating conductor can, for example, be connected to the two terminals of an external power supply. By means of multiple connection elements, different antennas applied on the substrate as electrically conductive structures can, for example, be contacted. Due to the small dimensions and reduction of thermal stresses, connection elements according to the invention are particularly suited for panes on which multiple connection elements can be disposed, even with little distance between them. The connection elements are preferably disposed in a line. The distance between adjacent connection elements is preferably from 5 mm to 50 mm, particularly preferably from 10 mm to 20 mm. This arrangement is advantageous from a production technology standpoint and for aesthetic reasons. In particular, the connection elements in this relative arrangement can be fixed, for example, before soldering in a shared mounting bracket. The side edges of the soldering regions of the different connection elements are preferably disposed parallel to each other and can have, relative to the (imaginary) line on which the connection elements are disposed, any angle, preferably from 5° to 90°, particularly preferably from 10° to 40°. The crimped regions of the different connection elements are preferably disposed on the same side of the (imaginary) line. Such an arrangement is particularly space-saving.

The substrate has a first coefficient of thermal expansion. The connection element has a second coefficient of thermal expansion. In an advantageous embodiment of the invention, the difference between the first and the second coefficient of thermal expansion is less than $5 \times 10^{-6}/°$ C., particularly preferably less than $3 \times 10^{-6}/°$ C. Because of this, the thermal stresses in the pane are reduced and better adhesion is obtained.

The substrate contains, preferably, glass, particularly preferably flat glass, float glass, quartz glass, borosilicate glass, and/or soda lime glass. However, the substrate can also contain polymers, preferably polyethylene, polypropylene, polycarbonate, polymethyl methacrylate, polystyrene, polybutadiene, polynitriles, polyester, polyurethane, polyvinyl chloride, polyacrylate, polyamide, polyethylene terephthalate, and/or copolymers or mixtures thereof. The substrate is preferably transparent. The substrate preferably has a thickness from 0.5 mm to 25 mm, particularly preferably from 1 mm to 10 mm, and very particularly preferably from 1.5 mm to 5 mm.

The first coefficient of thermal expansion is preferably from $8\times10^{-6}/°$ C. to $9\times10^{-6}/°$ C. The substrate preferably contains glass that has, preferably, a coefficient of thermal expansion from $8.3\times10^{-6}/°$ C. to $9\times10^{-6}/°$ C. in a temperature range from 0° C. to 300° C.

The second coefficient of thermal expansion is preferably from $9\times10^{-6}/°$ C. to $13\times10^{-6}/°$ C., particularly preferably from $10\times10^{-6}/°$ C. to $11.5\times10^{-6}/°$ C., very particularly preferably from $10\times10^{-6}/°$ C. to $11\times10^{-6}/°$ C., and in particular from $10\times10^{-6}/°$ C. to $10.5\times10^{-6}/°$ C. in a temperature range from 0° C. to 300° C.

The connection element according to the invention preferably includes a chromium-containing steel with a chromium proportion greater than or equal to 10.5 wt.-%. Other alloy components such as molybdenum, manganese, or niobium result in an improved corrosion resistance or altered mechanical properties, such as tensile strength or cold formability.

The connection element according to the invention preferably includes at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and 0 wt.-% to 1 wt.-% titanium. The connection element can also include admixtures of other elements, including vanadium, aluminum, and nitrogen.

The connection element according to the invention particularly preferably includes at least 73 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1.5 wt.-% molybdenum, 0 wt.-% to 1 wt.-% niobium, and 0 wt.-% to 1 wt.-% titanium. The connection element can also include admixtures of other elements, including vanadium, aluminum, and nitrogen.

The connection element according to the invention very particularly preferably includes at least 77 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, 0 wt.-% to 1.5 wt.-% molybdenum, and 0 wt.-% to 1 wt.-% titanium. The connection element can also include admixtures of other elements, including vanadium, aluminum, and nitrogen.

Particularly suitable chrome-containing steels are steels of the material numbers 1.4016, 1.4113, 1.4509, and 1.4510 in accordance with EN 10 088-2.

The electrically conductive structure according to the invention has, preferably, a layer thickness from 5 µm to 40 µm, particularly preferably from 5 µm to 20 µm, very particularly preferably, from 8 µm to 15 µm, and, in particular, from 10 µm to 12 µm. The electrically conductive structure according to the invention contains, preferably, silver, particularly preferably, silver particles and glass frits.

The layer thickness of the solder material is preferably less than or equal to $6.0\times10^{-4}$ m, particularly preferably less than $3.0\times10^{-4}$ m.

The solder material according to the invention is leadfree. This is particularly advantageous in view of the environmental impact of the pane with an electrical connection element according to the invention. In the context of the invention, "leadfree solder material" means a solder material that includes, in accordance with EC Directive "2002/95/EC on the Restriction of the Use of Certain Hazardous Substances in Electrical and Electronic Equipment", a lead proportion less than or equal to 0.1 wt.-%, preferably no lead.

Leadfree solder materials typically have less ductility than lead-containing solder materials, such that mechanical stresses between a connection element and a pane can be less well compensated. However, it has been demonstrated that critical mechanical stresses can clearly be prevented by means of the connection element according to the invention. The solder material according to the invention contains, preferably, tin and bismuth, indium, zinc, copper, silver, or compositions thereof. The proportion of tin in the solder composition according to the invention is from 3 wt.-% to 99.5 wt.-%, preferably from 10 wt.-% to 95.5 wt.-%, particularly preferably from 15 wt.-% to 60 wt.-%. The proportion of bismuth, indium, zinc, copper, silver, or compositions thereof in the solder composition according to the invention is from 0.5 wt.-% to 97 wt.-%, preferably 10 wt.-% to 67 wt.-%, whereby the proportion of bismuth, indium, zinc, copper, or silver can be 0 wt.-%. The solder composition can contain nickel, germanium, aluminum, or phosphorus at a proportion of 0 wt.-% to 5 wt.-%. The solder composition according to the invention contains, very particularly preferably, Bi40Sn57Ag3, Sn40Bi57Ag3, Bi59Sn40Ag1, Bi57Sn42Ag1, In97Ag3, Sn95.5Ag3.8Cu0,7, Bi67In33, Bi33In50Sn17, Sn77.2In20Ag2.8, Sn95Ag4Cu1, Sn99Cu1, Sn96.5Ag3.5, Sn96.5Ag3Cu0.5, Sn97Ag3, or mixtures thereof.

In an advantageous embodiment, the solder material contains bismuth. It has been demonstrated that a bismuth-containing solder material results in particularly good adhesion of the connection element according to the invention to the pane, by means of which damage to the pane can be avoided. The proportion of bismuth in the solder material composition is preferably from 0.5 wt.-% to 97 wt.-%, particularly preferably 10 wt.-% to 67 wt.-%, and very particularly preferably from 33 wt.-% to 67 wt.-%, in particular from 50 wt.-% to 60 wt.-%. In addition to bismuth, the solder material preferably contains tin and silver or tin, silver, and copper. In a particularly preferred embodiment, the solder material includes at least 35 wt.-% to 69 wt.-% bismuth, 30 wt.-% to 50 wt.-% tin, 1 wt.-% to 10 wt.-% silver, and 0 wt.-% to 5 wt.-% copper. In a very particularly preferred embodiment, the solder material contains at least 49 wt.-% to 60 wt.-% bismuth, 39 wt.-% to 42 wt.-% tin, 1 wt.-% to 4 wt.-% silver, and 0 wt.-% to 3 wt.-% copper.

In another advantageous embodiment, the solder material contains from 90 wt.-% to 99.5 wt.-% tin, preferably from 95 wt.-% to 99 wt.-%, particularly preferably from 93 wt.-% to 98 wt.-%. In addition to tin, the solder material preferably contains from 0.5 wt.-% to 5 wt.-% silver and from 0 wt.-% to 5 wt.-% copper.

The solder material flows out with an outflow width of less than 1 mm from the intermediate space between the solder region of the connection element and the electrically conductive structure. In a preferred embodiment, the maximum outflow width is less than 0.5 mm and, in particular, roughly 0 mm. This is particularly advantageous with regard to the reduction of mechanical stresses in the pane, the adhesion of the connection element, and the reduction in the amount of solder. The maximum outflow width is defined as the distance between the outer edges of the solder region and the point of the solder material crossover, at which the solder material drops below a layer thickness of 50 µm. The maximum outflow width is measured on the solidified solder material after the soldering process. A desired maximum outflow width is obtained through a suitable selection of solder material volume and vertical distance between the connection element and the electrically conductive structure, which can be determined by simple experiments. The vertical distance between the connection element and the electrically conductive structure can be predefined by an appropriate process tool, for example, a tool with an integrated spacer. The maximum outflow width can even be negative, i.e., pulled back into the intermediate space formed by the solder region of the electrical connection element and an electrically conductive structure. In an advantageous embodiment of the pane according to the invention, the maximum outflow width is pulled back in a concave meniscus into the intermediate space formed by the solder region of the electrical connection element and the electrically conductive structure. A concave meniscus is created, for example, by increasing the vertical distance between the spacer and the conductive structure during the soldering process, while the solder is still fluid. The advantage resides in the reduction of mechanical stresses in the pane, in particular, in the critical region present with a large solder material crossover.

In an advantageous embodiment of the invention, the contact surface of the connection element has spacers, preferably at least two spacers, particularly preferably at least three spacers. The spacers are disposed on the contact surface between the connection element and the solder material and are preferably formed in one piece with the connection element, for example, by stamping or deep drawing. The spacers preferably have a width of $0.5 \times 10^{-4}$ m to $10 \times 10^{-4}$ m and a height of $0.5 \times 10^4$ m to $5 \times 10^{-4}$ m, particularly preferably of $10^{-4}$ m to $3 \times 10^{-4}$ m. By means of the spacers, a homogeneous, uniformly thick, and uniformly fused layer of the solder material is obtained. Thus, mechanical stresses between the connection element and the pane can be reduced and the adhesion of the connection element can be improved. This is particularly advantageous with the use of leadfree solder materials that can compensate mechanical stresses less well due to their lower ductility compared to lead-containing solder materials.

In an advantageous embodiment of the invention, at least one contact bump, which serves for contacting the connection element with the soldering tool during the soldering process, is disposed on the surface of the solder region of the connection element facing away from the substrate. The contact bump is preferably curved convexly at least in the region of contacting with the soldering tool. The contact bump preferably has a height of 0.1 mm to 2 mm, particularly preferably of 0.2 mm to 1 mm. The length and width of the contact bump is preferably between 0.1 and 5 mm, very particularly preferably between 0.4 mm and 3 mm. The contact bumps are preferably implemented in one piece with the connection element, for example, by stamping or deep drawing. For the soldering, electrodes whose contact side is flat can be used. The electrode surface is brought into contact with the contact bump. For this, the electrode surface is disposed parallel to the surface of the substrate. The contact region between the electrode surface and the contact bump forms the soldering point. The position of the soldering point is determined by the point on the convex surface of the contact bump that has the greatest vertical distance from the surface of the substrate. The position of the soldering point is independent of the position of the solder electrode on the connection element. This is particularly advantageous with regard to a reproducible, uniform heat distribution during the soldering process. The heat distribution during the soldering process is determined by the position, the size, the arrangement, and the geometry of the contact bump.

The electrical connection element has, preferably at least on the contact surface facing the solder material, a coating (wetting layer) that contains nickel, copper, zinc, tin, silver, gold, or alloys or layers thereof, preferably silver. By this means, improved wetting of the connection element with the solder material and improved adhesion of the connection element are achieved.

The connection element according to the invention is preferably coated with nickel, tin, copper, and/or silver. The connection element according to the invention is particularly preferably provided with an adhesion-promoting layer, preferably made of nickel and/or copper, and, additionally, with a solderable layer, preferably made of silver. The connection element according to the invention is coated, very particularly preferably, with 0.1 μm to 0.3 μm nickel and/or 3 μm to 20 μm silver. The connection element can be plated with nickel, tin, copper, and/or silver. Nickel and silver improve the current-carrying capacity and corrosion stability of the connection element and the wetting with the solder material.

The shape of the electrical connection element can form one or a plurality of solder depots in the intermediate space of the connection element and the electrically conductive structure. The solder depots and wetting properties of the solder on the connection element prevent the outflow of the solder material from the intermediate space. The solder depots can be rectangular, rounded, or polygonal in design.

The object of the invention is further accomplished through a method for production of a pane according to the invention with at least one electrical connection element, wherein a) the connection element is connected to the connection cable by crimping in a region, b) solder material is applied on the bottom of the solder region, c) the connection element with the solder material is disposed on a region of an electrically conductive structure that is applied on a region of a substrate, and d) the connection element is connected, with energy input, to the electrically conductive structure.

The solder material is preferably applied to the connection element as a platelet or a flattened drop with a fixed layer thickness, volume, shape, and arrangement. The layer thickness of the solder material platelet is preferably less than or equal to 0.6 mm. The shape of the solder material platelet preferably corresponds to the shape of the contact surface. If the contact surface is implemented, for example, as a rectangle, the solder material platelet preferably has a rectangular shape.

The introduction of the energy during the electrical connecting of an electrical connection element and an electrically conductive structure occurs preferably by means of punches, thermodes, piston soldering, preferably laser soldering, hot air soldering, induction soldering, resistance soldering, and/or with ultrasound.

The electrically conductive structure can be applied to the substrate by methods known per se, for example, by screen-printing methods. The application of the electrically conductive structure can take place before, during, or after the process steps (a) and (b).

The connection element is preferably used in heated panes or in panes with antennas in buildings, in particular, in automobiles, railroads, aircraft, or watercraft. The connection element serves to connect the conducting structures of the pane to electrical systems that are disposed outside the pane. The electrical systems are amplifiers, control units, or voltage sources.

The invention further includes the use of the pane according to the invention in buildings or in means of transportation for travel on land, in the air, or on water, in particular in rail vehicles or motor vehicles, preferably as a windshield, rear window, side window, and/or glass roof, in particular as a heatable pane or as a pane with an antenna function.

Figure 2:
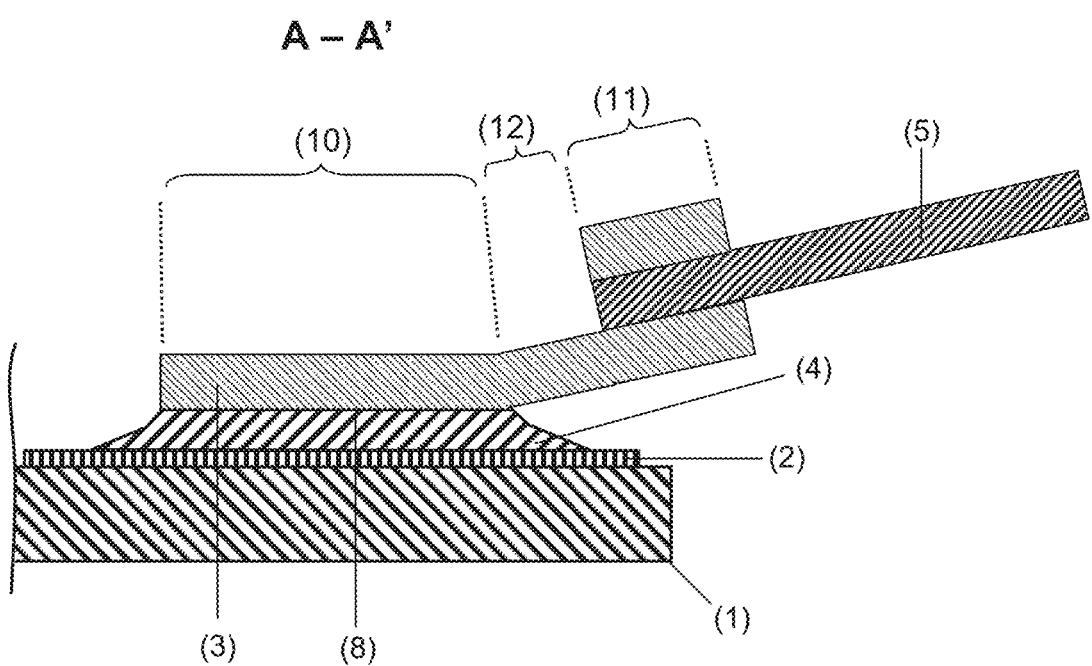
Figure 3:
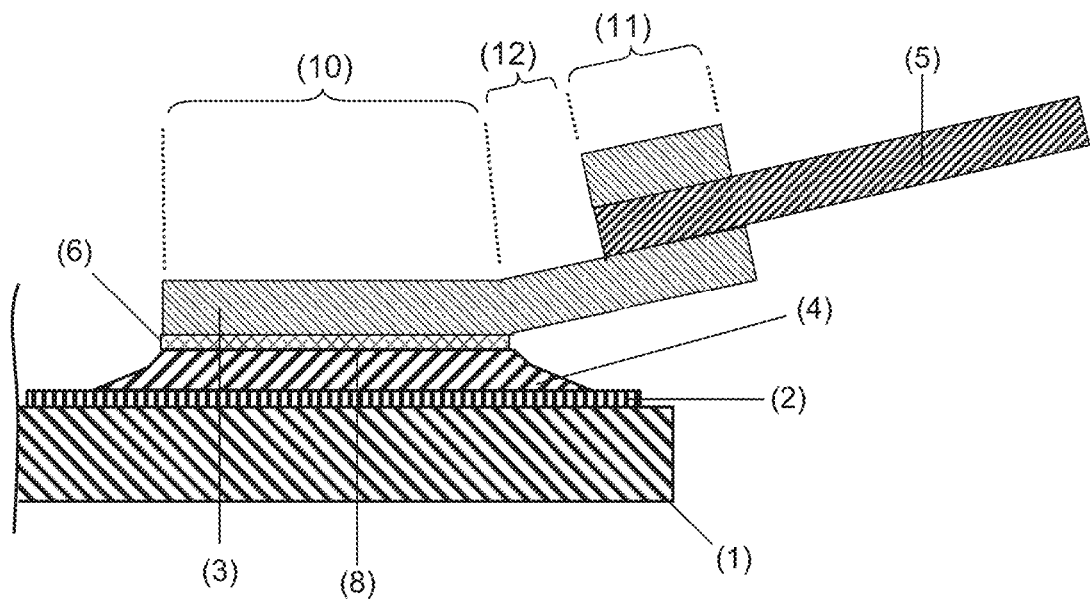
Figure 4:
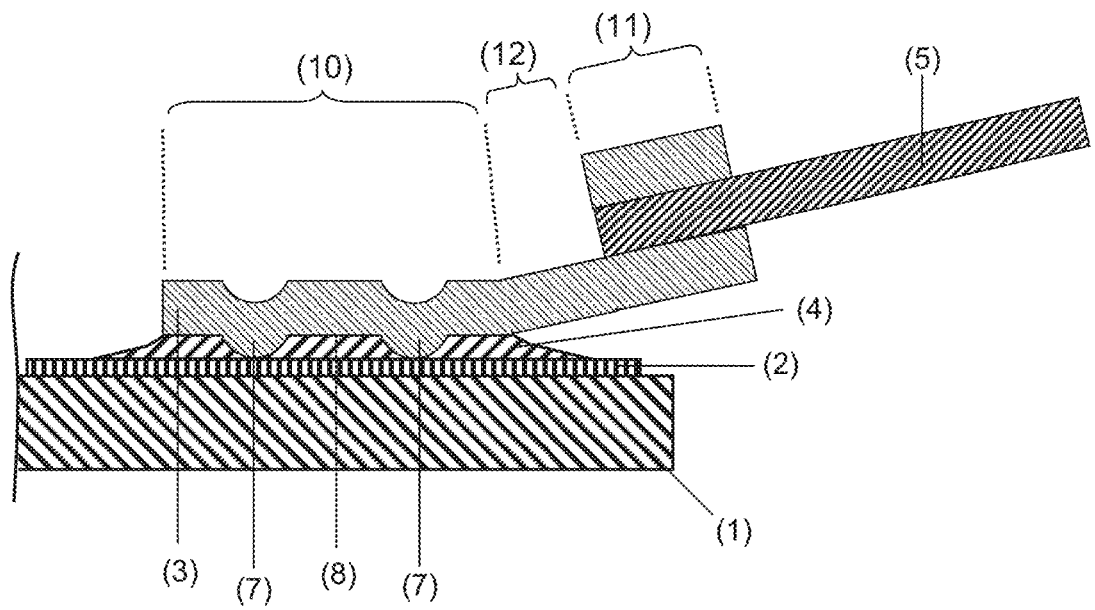
Figure 5:
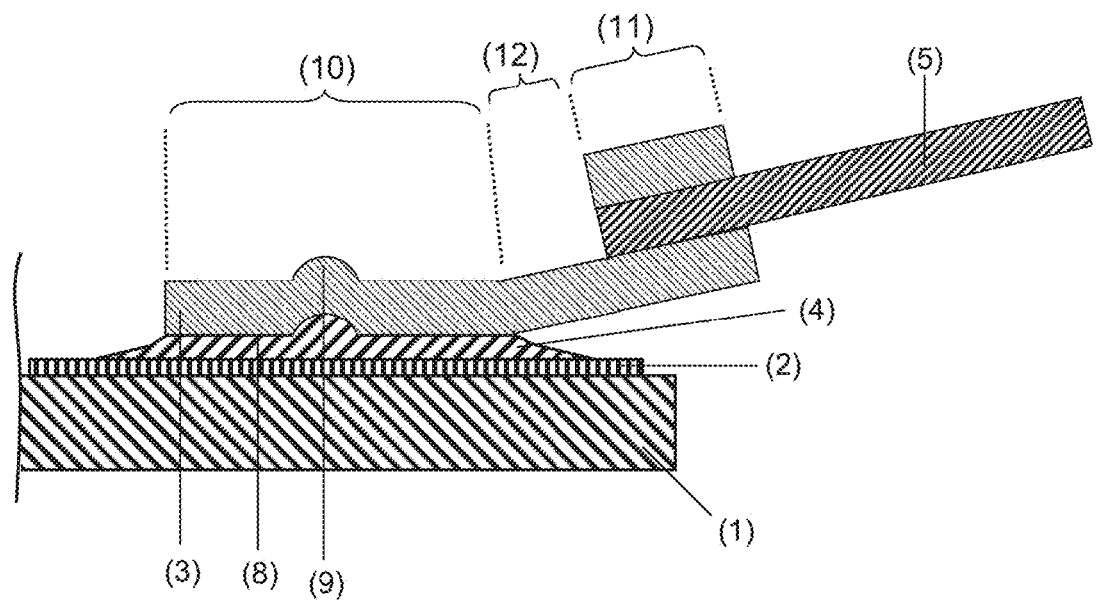
Figure 6:
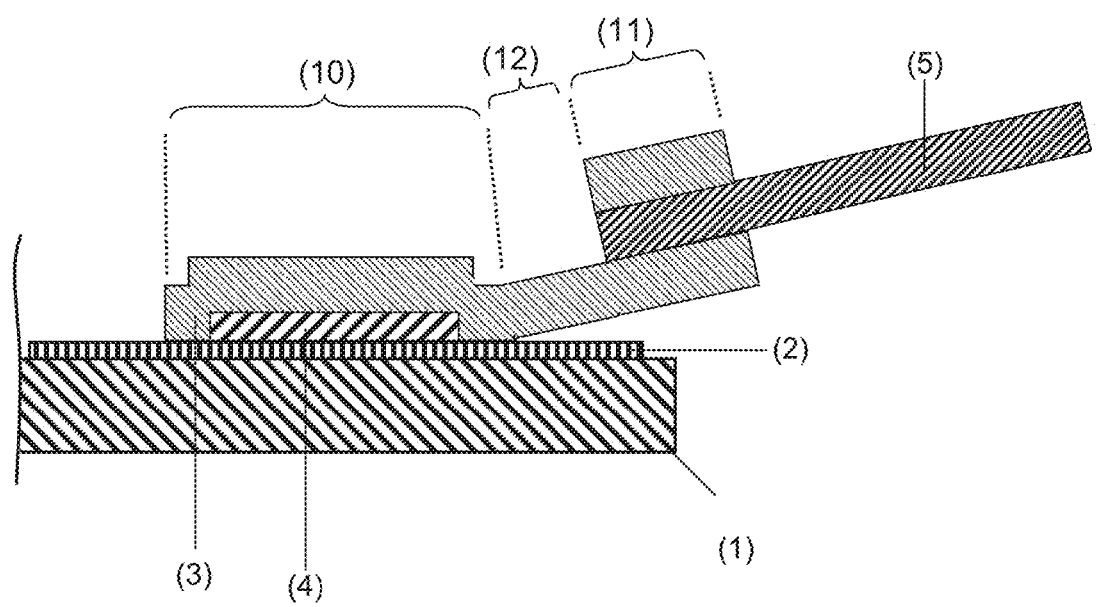
Figure 7:
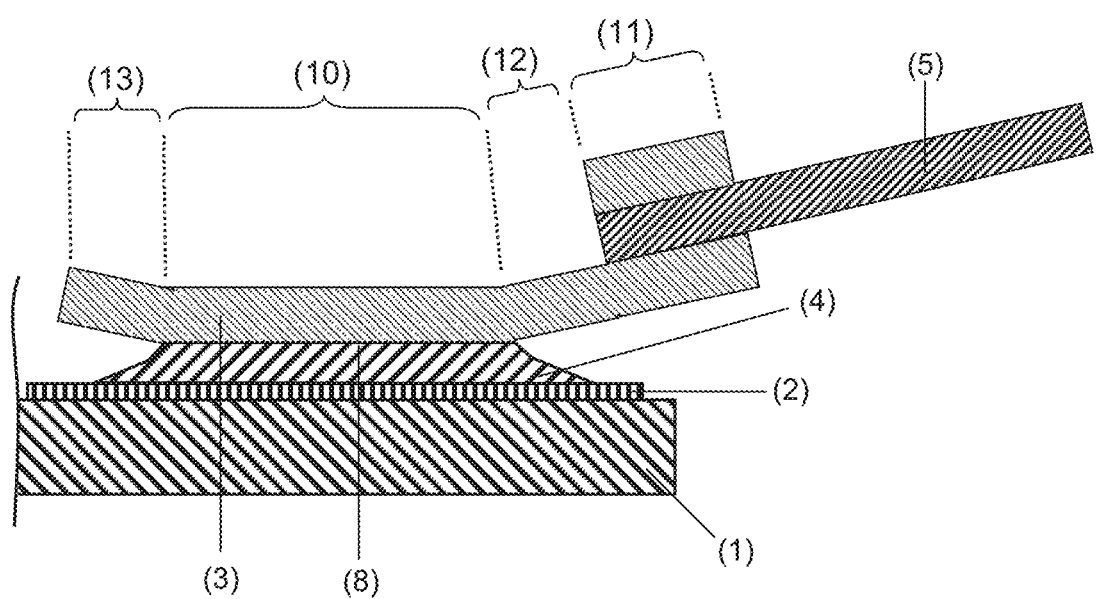
Figure 8:
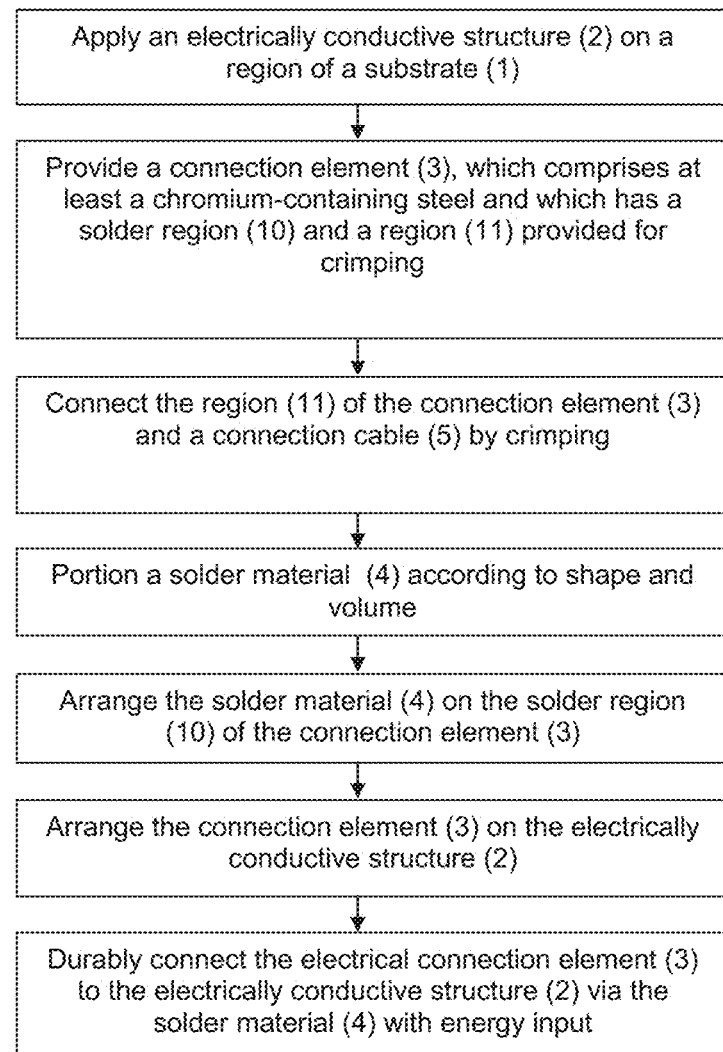

The invention is explained in detail with reference to drawings and exemplary embodiments. The drawings are schematic representations and not true to scale. The drawings in no way restrict the invention. They depict:

FIG. 1 a perspective view of a first embodiment of the pane according to the invention, FIG. 2 a cross-section A-A' through the pane of FIG. 1, FIG. 3 a cross-section A-A' through an alternative pane according to the invention, FIG. 4 a cross-section A-A' through another alternative pane according to the invention, FIG. 5 a cross-section A-A' through another alternative pane according to the invention, FIG. 6 a cross-section B-B' through another alternative pane according to the invention, FIG. 7 a cross-section B-B' through another alternative pane according to the invention, FIG. 8 a detailed flow chart of the method according to the invention.

FIG. 1 and FIG. 2 depict in each case a detail of a pane according to the invention in the region of the electrical connection element 3. The pane comprises a substrate 1, which is a 3-mm-thick thermally prestressed single pane safety glass made of soda lime glass. The substrate 1 has a width of 150 cm and a height of 80 cm. An electrically conductive structure 2 in the form of a heating conductor structure is printed on the substrate 1. The electrically conductive structure 2 contains silver particles and glass frits. In the edge region of the pane, the electrically conductive structure 2 is widened to a width of 10 mm and forms a contact surface for an electrical connection element 3. The connection element 3 serves for the electrical contacting of the electrically conductive structure 2 with an internal power supply via a connection cable 5. The connection cable 5 includes an electrically conductive core that is implemented as a conventional stranded wire conductor made of copper. The connection cable 5 further includes a polymer insulating sheathing (not shown) that is removed in the end region to the length of 4.5 mm to enable the electrical contacting of the electrically conductive core of the connection cable 5 with the connection element 3. A covering screenprint (not shown) is also situated in the edge region of the substrate 1.

The electrical connection element 3 is made of steel of the material number 1.4509 in accordance with EN 10 088-2 (ThyssenKrupp Nirosta® 4509) with a coefficient of thermal expansion of $10.5 \times 10^{-6}/°$ C. in the temperature range from 20° C. to 300° C. The material thickness of the connection element 3 is, for example, 0.4 mm. The connection element has a region 11 with a length of, for example, 4 mm, which is crimped around the end region of the connection cable 5. For this, the side edges of the crimped region 11 are bent around the connection cable 5 and squeezed therewith. The crimp is disposed such that the region of the substrate 1 bent around points away from the substrate 1. By this means, an advantageously small angle can be realized between the crimped region 11 and the substrate 1. However, in principle, the reversed arrangement of the crimp is also possible.

The connection element 3 further has a substantially rectangular, flat solder region 10, which is connected to the crimped region 11 via a transition region 12. The solder region 10 has, for example, a length of 4 mm and a width of 2.5 mm. The transition region 12 has, for example, a length of 1 mm. The solder region 10 is disposed on the side of the crimped region 11 that faces the extension direction of the connection cable 5. The angle between the solder region 10 and the crimped region 11 is, for example, 160°. The transition region 12 is implemented flat, but can, for example, alternatively also be implemented curved and/or bent.

The surface of the solder region 10 facing the substrate 1 forms a contact surface 8 between the electrical connection element 3 and the electrically conductive structure 2. Solder material 4, which effects a durable electrical and mechanical connection between the electrical connection element 3 and the electrically conductive structure 2, is applied in the region of the contact surface 8. The solder material 4 contains 57 wt.-% bismuth, 40 wt.-% tin, and 3 wt.-% silver. The solder material 4 has a thickness of 250 µm. The solder region 10 is connected to the electrically conductive structure 2 via the contact surface 8 over its entire area.

FIG. 3 depicts a cross-section through an alternative embodiment of the pane according to the invention with the connection element 3. The contact surface 8 of the connection element 3 is provided with a silver-containing wetting layer 6, for example, with a thickness of roughly 5 µm. This improves the adhesion of the connection element 3. In another embodiment, an adhesion-promoting layer, made, for example, of nickel and/or copper can be situated between the connection element 3 and the wetting layer 6.

FIG. 4 depicts a cross-section through an alternative embodiment of the pane according to the invention with the connection element 3. Spacers 7 are disposed on the contact surface 8 of the connection element 3. For example, four spacers 7, of which two spacers 7 can be discerned in the section depicted, can be disposed on the contact surface 8. The spacers 7 are stamped into the solder region 10 of the connection element 3 and thus implemented in one piece with the connection element 3. The spacers 7 are shaped as spherical segments and have a height of $2.5 \times 10^{-4}$ m and a width of $5 \times 10^{-4}$ m. By means of the spacers 7, the formation of a uniform layer of the solder material 4 is promoted. This is particularly advantageous with regard to the adhesion of the connection element 3.

FIG. 5 depicts a cross-section through an alternative embodiment of the pane according to the invention with the connection element 3. A contact bump 9 is disposed on the surface of the soldering region 10 of the connection element 3 facing away from the substrate 1 and opposite the contact surface 8. The contact bump 9 is stamped into the solder region 10 of the connection element 3 and thus implemented in one piece with the connection element 3. The contact bump 9 is shaped as a spherical segment and has a height of $2.5 \times 10^{-4}$ m and a width of $5 \times 10^{-4}$ m. The contact bump 9 serves for the contacting of the connection element 3 with the soldering tool during the soldering process. By means of the contact bump 9, a reproducible and defined heat distribution is ensured independent of the exact positioning of the soldering tool.

FIG. 6 depicts a cross-section through an alternative embodiment of the pane according to the invention with the connection element 3. The electrical connection element 3 includes, on the contact surface 8 facing the solder material 4, a recess with a depth of 250 µm, which is stamped into the solder region 10 and which forms a solder depot for the solder material 4. Outflow of the solder material 4 from the intermediate space can be completely prevented. By this means, the thermal stresses in the pane are further reduced.

FIG. 7 depicts a cross-section through an alternative embodiment of the pane according to the invention with the connection element 3. The connection element 3 has, in addition to the crimped region 11, the transition region 12, and the solder region 10, a further region 13, adjacent the solder region 10. The further region 13 and the transition region 12 with the crimped region 11 are connected to opposing edges of the solder region 10.

FIG. 8 depicts in detail a method according to the invention for production of a pane with an electrical connection element 3.

Test specimens were produced with the substrate 1 (thickness 3 mm, width 150 cm, and height 80 cm), the electrically conductive structure 2 in the form of a heating conductor structure, the electrical connection element 3 according to FIG. 1, and the solder material 4. The connection element 3 was made of steel of the material number 1.4509 in accordance with EN 10 088-2, which has a coefficient of thermal expansion of $10.0 \times 10^{-6}/°$ C. in the temperature range from 20° C. to 200° C. and a coefficient of thermal expansion of $10.5 \times 10^{-6}/°$ C. in the temperature range from 20° C. to 300° C. The substrate 1 was made of soda lime glass with a coefficient of thermal expansion of $8.30 \times 10^{-6}/°$ C. in the temperature range from 20° C. to 300° C. The solder material 4 contained Sn40Bi57Ag3 and had a layer thickness of 250 μm. The connection element 3 was soldered onto the electrically conductive structure 2 at a temperature of 200° C. and a processing time of 2 seconds. No critical mechanical stresses were observed in the pane. The connection of the pane to the electrical connection element 3 via the electrically conductive structure 2 was durably stable. With all specimens, it was possible to observe, with a temperature difference from +80° C. to −30° C., that no substrate 1 broke or showed damage. It was possible to demonstrate that, shortly after soldering, the panes with the soldered connection element 3 were stable against a sudden temperature drop.

In comparative examples with connection elements that had the same shape and were made of copper or brass, clearly greater mechanical stresses occurred and with a sudden temperature difference from +80° C. to −30° C., it was observed that the pane had major damage shortly after soldering. It was demonstrated that panes according to the invention with glass substrates 1 and electrical connection elements 3 according to the invention had better stability against sudden temperature differences. This result was unexpected and surprising for the person skilled in the art.

LIST OF REFERENCE CHARACTERS (1) substrate
(2) electrically conductive structure
(3) electrical connection element
(4) solder material
(5) connection cable
(6) wetting layer
(7) spacer
(8) contact surface of the connection element 3 with the electrically conductive structure 2
(9) contact bump
(10) solder region of the connection element 3
(11) crimped region of the connection element 3
(12) transition region between the crimped region 11 and the solder region 10
(13) another region of the connection element 3
A-A' section line

The invention claimed is:

1. A pane with at least one electrical connection element, comprising:
   a substrate;
   on a region of the substrate, an electrically conductive structure; and
   on a region of the electrically conductive structure, a connection element that comprises at least a chromium-containing steel,
   wherein the connection element has, at a distal end of the connection element, a region crimped around a connection cable, and a solder region that is connected to the electrically conductive structure via a leadfree solder material, and
   wherein the connection element comprises at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and 0 wt.-% to 1 wt.-% titanium.

2. The pane according to claim 1, wherein an angle between the solder region and the crimped region is from 120° to 180°.

3. The pane according to claim 1, which includes two to six connection elements disposed in a line.

4. The pane according to claim 1, wherein a material thickness of the connection element is from 0.1 mm to 2 mm.

5. The pane according to claim 1, wherein a difference between a coefficient of thermal expansion of the substrate and the coefficient of thermal expansion of the connection element is less than $5 \times 10^{-6}/°$ C.

6. The pane according to claim 1, wherein the connection element comprises at least 77 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, 0 wt.-% to 1.5 wt.-% molybdenum, and 0 wt.-% to 1 wt.-% titanium.

7. The pane according to claim 1, wherein the substrate contains glass.

8. The pane according to claim 1, wherein the electrically conductive structure contains at least silver and has a layer thickness of 5 μm to 40 μm.

9. The pane according to claim 1, wherein a layer thickness of the solder material is less than or equal to $6.0 \times 10^{-4}$ m.

10. The pane according to claim 1, wherein the solder material contains tin and bismuth, indium, zinc, copper, silver, or compositions thereof.

11. The pane according to claim 10, wherein the solder material contains 35 wt.-% to 69 wt.-% bismuth, 30 wt.-% to 50 wt.-% tin, 1 wt.-% to 10 wt.-% silver, and 0 wt.-% to 5 wt.-% copper.

12. The pane according to claim 1, wherein the connection element has at least a wetting layer that contains nickel, tin, copper, and/or silver.

13. A method for production of the pane with at least one electrical connection element, comprising:
   connecting a connection element to a connection cable by crimping in a region at a distal end of the connection element;
   applying a solder material on a bottom of a solder region of the connection element;
   disposing the connection element with the solder material on a region of an electrically conductive structure that is applied on a region of a substrate; and connecting the connection element, with energy input, to the electrically conductive structure.

14. A method comprising:
applying the pane with at least one electrical connection element according to claim 1, in buildings or in means of transportation for travel on land, in the air, or on water.

15. The pane according to claim 2, wherein the angle between the solder region and the crimped region is from 150° to 170°.

16. The pane according to claim 3, wherein a distance between adjacent connection elements is from 5 mm to 50 mm.

17. The pane according to claim 3, wherein a distance between adjacent connection elements is from 10 mm to 20 mm.

18. The pane according to claim 4, wherein a material thickness of the connection element is from 0.2 mm to 1 mm.

19. The pane according to claim 4, wherein a material thickness of the connection element is from 0.3 mm to 0.5 mm.

20. The pane according to claim 7, wherein the glass comprises: float glass, quartz glass, borosilicate glass, and/or soda lime glass.

21. The pane according to claim 8, wherein the at least silver comprises silver particles and glass frits.

22. The method according to claim 14, comprising:
applying the pane with at least one electrical connection element according to claim 1 as a windshield, rear window, side window, and/or glass roof.

23. The method according to claim 14, comprising:
applying the pane with at least one electrical connection element according to claim 1 as a heatable pane or as a pane with an antenna function.

* * * * *